(12) United States Patent
Emery et al.

(10) Patent No.: US 8,901,947 B2
(45) Date of Patent: Dec. 2, 2014

(54) PROBE OUT-OF-POSITION SENSING FOR AUTOMATED TEST EQUIPMENT

(71) Applicant: Electro Scientific Industries, Inc., Portland, OR (US)

(72) Inventors: Joseph Johann Emery, Vancouver, WA (US); Jae H. Kim, Lake Oswego, OR (US); Daniel Joel Boatright, Tigard, OR (US); Michael Charley Stocks, Portland, OR (US); James Ray Huntington, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 267 days.

(21) Appl. No.: 13/629,924

(22) Filed: Sep. 28, 2012

(65) Prior Publication Data
US 2014/0091820 A1 Apr. 3, 2014

(51) Int. Cl.
*G01R 31/28* (2006.01)
(52) U.S. Cl.
USPC .................................................. 324/754.01
(58) Field of Classification Search
CPC . G01R 1/06794; G01R 29/12; G01R 31/2831
USPC ............... 324/754.01–754.3, 755.01–755.11, 324/762.01–762.1
See application file for complete search history.

(56) References Cited

U.S. PATENT DOCUMENTS

| | | | |
|---|---|---|---|
| 5,012,186 A | 4/1991 | Gleason | |
| 6,191,605 B1 * | 2/2001 | Miller et al. | 324/762.07 |
| 6,201,401 B1 * | 3/2001 | Hellemans et al. | 324/719 |
| 6,600,334 B1 | 7/2003 | Wark et al. | |
| 6,650,135 B1 | 11/2003 | Mautz et al. | |
| 6,825,680 B1 | 11/2004 | Kogan et al. | |
| 7,330,025 B1 | 2/2008 | Beach et al. | |
| 7,688,096 B2 | 3/2010 | Inomata | |
| 7,855,568 B2 | 12/2010 | Yamada | |
| 7,892,863 B2 | 2/2011 | Wilby et al. | |
| 8,200,447 B2 | 6/2012 | Wilby et al. | |

FOREIGN PATENT DOCUMENTS

| | | |
|---|---|---|
| JP | Hei 11-176893 A | 7/1999 |
| JP | 2004-069429 A | 3/2004 |
| JP | 2004-286497 A | 10/2004 |
| JP | 2005-227116 A | 8/2005 |
| KR | 10-2007-0040713 A | 4/2007 |

OTHER PUBLICATIONS

Korean Intellectual Property Office, International Search Report and Written Opinion in corresponding International Application No. PCT/US2013/057488, dated Dec. 12, 2013.

* cited by examiner

*Primary Examiner* — Tung X Nguyen

(57) ABSTRACT

Detecting misalignment of test probes with component carriers in an automated test system is taught. Automated test systems for testing electronic components can have electronic components held in component carriers in preparation for testing. Testing can include moving test probes through openings provided in the component carrier to contact the electronic components held therein. Aspects of disclosed implementations use force feedback from the test probes to determine if the test probes have successfully contacted the electronic component without, for example, contacting the component carrier.

20 Claims, 6 Drawing Sheets

US 8,901,947 B2

PROBE OUT-OF-POSITION SENSING FOR AUTOMATED TEST EQUIPMENT

TECHNICAL FIELD

This disclosure relates in general to testing electronic components using an automated test system.

BACKGROUND

Electronic devices of all types, including computing devices, consumer products, telecommunications equipment and automotive electronics, for example, contain electronic components that can be passive or active components. Active electronic components include integrated circuits, multichip packages and semiconductor devices such as transistors and light emitting diodes (LEDs), for example. Passive electronic components include capacitors, resistors, inductors and packages containing multiple components such as multi-layer ceramic capacitors (MLCCs), for example. Both active and passive components are generally tested before being assembled into electronic devices. Testing can be performed both to insure reliability of the electronic components and to sort the electronic components into groups having similar electronic characteristics.

BRIEF SUMMARY

Disclosed herein are aspects of systems, methods and apparatuses for testing electronic components in an electronic component test system. One method disclosed herein includes moving a component carrier into a test station of the test system, moving a test probe in a direction toward the component carrier while the component is in the test station, the component carrier having an opening for the test probe to pass through when the test probe is in a test position, measuring a feedback force of the test probe while moving the test probe in the direction toward the component carrier, and determining whether the test probe makes contact with the component carrier based on the feedback force.

An apparatus for testing electronic components in an electronic component test system described herein includes a test station including a test probe configured to transmit a signal to an electronic component, a component carrier configured to support the electronic component and having an opening for the test probe to pass through when the component carrier is in the test station and the test probe is in a test position, a force measurement device configured to measure a feedback force of the test probe while moving the test probe in a direction toward the component carrier, and a controller configured to determine whether the test probe makes contact with the component carrier based on the feedback force.

Variations of these embodiments and other embodiments are described hereinafter. For example, in various embodiments, force feedback from test probes can be measured and the time at which the force feedback indicates that the probe has contacted a solid surface can be noted. Correlating the time of contact with the amount of force can indicate whether the probe has contacted the device under test, the component carrier or if no device is present.

DETAILED DESCRIPTION

Figure 1:
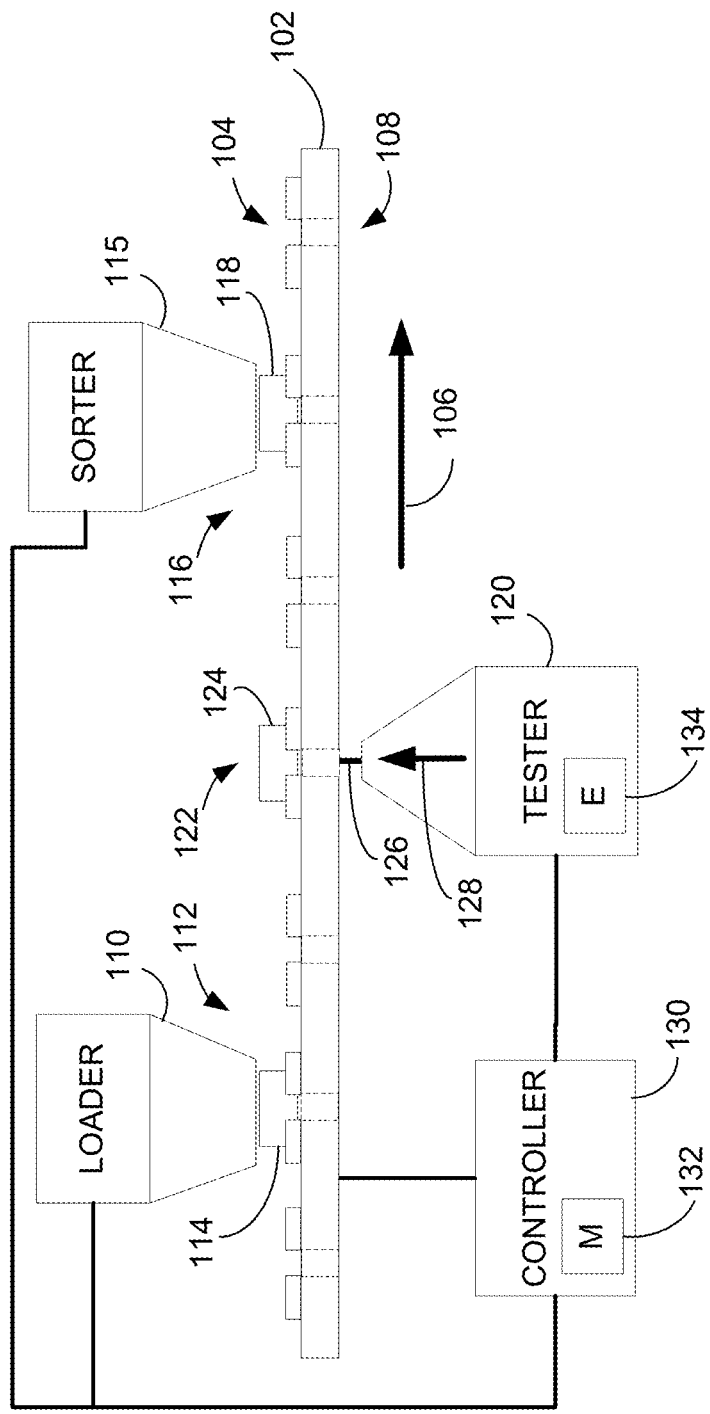
FIG. 1 is a block diagram of an example of an electronic component test system in which the teachings of this disclosure can be implemented.

Reliability testing for electronic components can include applying test signals to the components and comparing measured results against predetermined values to decide if the component is good or bad. Sorting electronic components can include applying test signals to the components and using the measured results to determine the performance qualities of the component and thereby determine how the component will be rated and marketed, for example. Both types of testing can use equipment in the form of test systems to handle large volumes of components at high speed without damaging the components while producing accurate test results over long periods of time relative to the amount of time required for testing a single component. For example, testing a single electronic component can take less than one second, while the test system can be expected to run continuously for many hours. As used herein the term signal refers to any electrical or electronic voltage, current, waveform, optical light rays, data, information or electromagnetic radiation supplied or received in any form, including wired or wireless.

Both reliability testing and sorting can be performed by probing, which means temporarily applying one or more conductive test leads to conductive areas on the electronic component, sometimes called "pads," and applying an electronic test signal to the electronic component. The system can then measure electrical properties of the electronic component in response to the test signal. Electrical properties measured with test probes, for example, can include measuring the resistance of the component, which can involve applying a known voltage and measuring the current flowing through the component. Capacitance, for example, can be measured by applying a known voltage and measuring the rate at which current flows into the device. A measurement can also be made in cooperation with other equipment, for example when testing LEDs, a known voltage and current can be applied to the LED and the light output measured by a photometric device.

Some electronic component test systems rely on component carriers to hold the electronic components securely while the components are being transported and tested. An example of an electronic component test system that employs component carriers is the ESI Model 3800 manufactured by Electro Scientific Industries, Inc., Portland Oreg. Component carriers can permit the test system to move components faster while still maintaining accurate positioning. Some electronic components, by virtue of their design, require that probing be done from the bottom of the device through holes formed in the bottom of the component carrier. For example, testing an LED device with contacts adjacent a bottom surface may require that the top or side of the component carrier be open to permit testing of the light output from the component.

In such cases, precise contact between the electrical device and its contacts is desirable. Contact can be done by movement of a probing module that brings electrical contacts (also called probes herein) in touch with electrical pads on the test component. When contact is made through a carrier, the position of the probing module is important to system performance. The timing of motion is desirably well-controlled due to the complexity of moving both carriers and probing modules. Incorrect positioning of either or both a carrier and a probing module is undesirable. More specifically, out-of-position probing can lead to damage (to probe contacts, carriers or components, for example), downtime and reduced machine throughput.

Additionally, in certain systems, a height position of the actuated contacts/probes can be important. For example, where homing routing with a hard stop is used, the height position is set during system installation/setup. If the homing routing is corrupted due to a mis-positioned hard stop, the positions that define "contact" and "no contact" may become corrupted as well, leading to contact and probe actuator module damage. The teachings herein can be used to address all of these issues.

FIG. 1 is a block diagram of an example of an electronic component test system 100 in which the teachings of this disclosure may be implemented. System 100 includes a track 102 having a plurality of component carriers 104 operating under control of a controller 130. Track 102 can be arranged as a disk, belt, or any other means of maintaining recirculating or reciprocating motion wherein electronic components can be loaded, tested and unloaded using track 102 and component carriers 104 attached to track 102. Component carriers 104 may be removably engaged with track 102 and are configured to receive one or more electronic components 114, 118, 124 to temporarily hold components 114, 118, 124 in a pose that permits testing and permits components 114, 118, 124 to be unloaded while being indexed by track 102.

Component carriers 104 can be indexed in the direction of arrow 106 from a load station 112 to a test station 122 and then to a sort station 116 in an intermittent or continuous fashion under control of controller 130. Controller 130 can be a computing device having a memory 132. The term "computing device" includes any device or multiple devices capable of processing information including without limitation: servers, hand-held devices, laptop computers, desktop computers, special purpose computers, and general purpose computers programmed to perform the techniques described herein. Memory 132 can be read only memory (ROM), random access memory (RAM) or any other suitable memory device or combination of devices capable of storing data, including disk drives or removable media such as a CF card, SD card or the like. In one implementation, controller 130 includes a central processing unit (CPU) that performs in accordance with a software program stored in memory 132 to perform the functions described herein. In another implementation, controller 130 includes hardware, such as application-specific integrated circuits (ASICs), microcontrollers or field-programmable gate arrays (FPGAs), programmed to perform some or all of the functions described herein.

As shown in FIG. 1, test system 100 under control of controller 130 loads electronic components at load station 112 with a loader 110, indexes components to test station 122 and unloads components at sort station 116 using a sorter 115. Indexing refers to a type of start/stop motion wherein track 102 can be stopped to hold component carriers 104 momentarily still at load station 112, test station 122 or sort station 116 to permit loading, testing or unloading and then can be re-started to move component carriers 104 to new positions at load station 112, test station 122 or sort station 116, where track 102 is again momentarily stopped to permit loading, testing or unloading and then re-started. The indexing movement between stations can optionally be performed in a series of smaller steps. Indexing proceeds continuously to permit numbers of components to be loaded, tested and unloaded/sorted efficiently and at high speed. Continuous movement is possible in some test systems.

At load station 112, loader 110 has, in one example, a bulk load of electronic components to be individually loaded on to a component carrier 104. Track 102 is indexed to position an empty component carrier 104 proximate to loader 110 at load station 112. Loader 110, under control of controller 130, loads an electronic component 114 into component carrier 104 at load station 112. Track 102 indexes a component carrier 104 with a loaded electronic component 124 to test station 122 under control of controller 130. At test station 122, a tester 120 can test component 124 by probing with probes 126 under control of controller 130. In this example, probing is accomplished by moving one or more probes 126 in the direction of arrow 128 through an opening 108 in track 102 and component carrier 104 to contact component 124.

Tester 120 contains test electronics 134 that can send signals though probes 126 to component 124 and can receive signals from component 124 through probes 126 to measure electrical properties of component 124. An example of test electronics 134 is the ESI Model 820 source/measurement unit, manufactured by Electro Scientific Industries, Inc., Portland, Oreg. The measured electrical properties and other signals generated by additional testing, for example photometric data from electro-optical components, can be sent to controller 130 for further processing or storage in memory 132. Following testing, tester 120 can retract probes 126 to permit track 102 to index the next electronic component to be tested to test station 122. Probes 126 may be, for example, Kelvin probes.

At sort station 116, an electronic component 118 can be unloaded from a component carrier 104 using sorter 115. Sorter 115 can remove component 118 using, for example, compressed air, vacuum or mechanical means. Sorter 115 can include one or more bins and one or more channels or tubes for conveying component 118 to one of the bins under control of controller 130 depending upon the results of testing of component 118. Sorting by sorter 115 can include simple "go/no go" sorting where electronic components that have measured electrical or optical properties indicating that they have failed testing are separated from electronic components that have passed testing based on their measured electrical properties. More elaborate sorting schemes where the measured electrical properties of electronic components are separated into multiple bins depending upon values of the measured electrical properties are also possible.

Note that although this description describes loading, testing and unloading one component resting in each component carrier 104, it may be desirable for multiple components to be loaded into multiple component carriers 104 for subsequent testing and unloading to speed processing. In this case, tester 120 could include a plurality of probes 126. When referring to a probe 126 and a measurement of the probe resistance herein, more than one probe 126 or set of probes 126 and more than one corresponding measurement is not excluded. Although not shown in FIG. 1, probe 126 is often supported by a probe module.

According to an embodiment of the teachings herein, out of position situations between the relative positions of a component carrier and a probe module can be sensed. When a test system is properly aligned and functioning, certain scenarios may occur. For example, if a carrier position is probed when no component is present to be tested, no feedback force would register over the entire range of travel of the probing module from a starting position to a test position (e.g., a position that would result in contact with the component if the component were present). If probing a carrier position when a component is present, a feedback force occurs when the contacts/probe reach the height of the component. Conversely, for a system that is not properly aligned, a feedback force occurs sooner when probing a carrier position than when a component is present and the system is aligned as the probing contacts are not allowed to protrude through the carrier before their motion is inhibited. That is, as the probe module moves into the test position, it would experience a feedback force before the normal time at which a feedback force would occur when the probing contacts reach a component. Depending upon how fast the system can react to an earlier than expected feedback force, it may be possible to prevent damage. For example, where misalignment occurs and a feedback force occurs early, the probe module may be able to be stopped before it reaches a hard stop position (e.g., the test position) where such a position exists. This fast feedback loop may minimize damage to the contacts of the probe module. Where there is no hard stop such that the test position is determined by the feedback force, reaching a target feedback force earlier than expected may instead indicate contact with the carrier.

Figure 2:
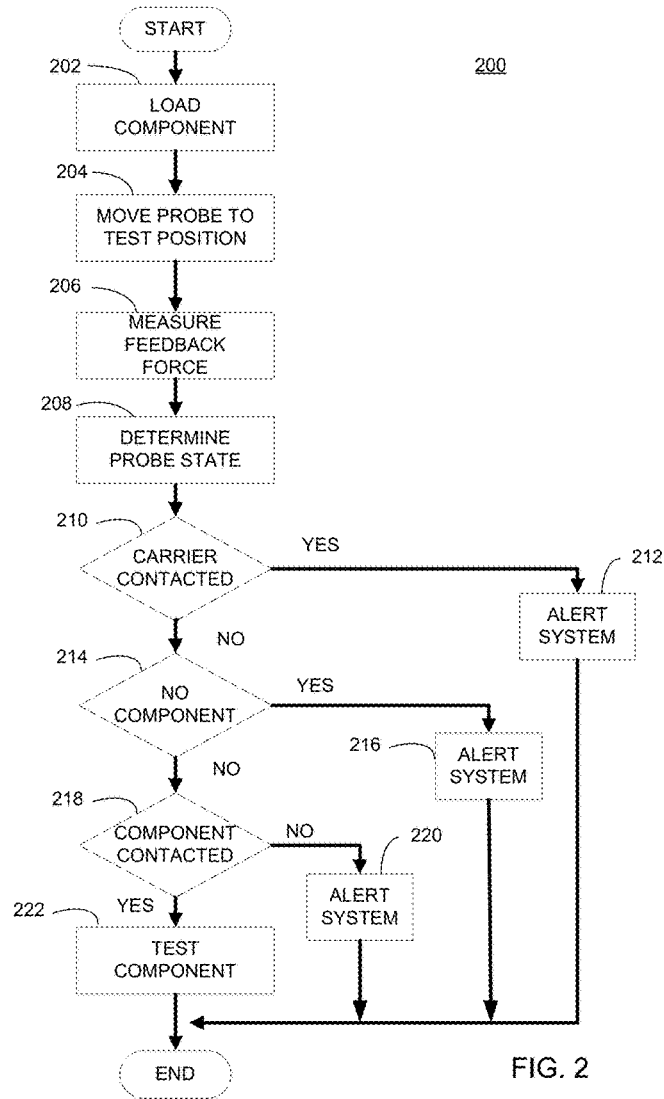
FIG. 2 is a flowchart of a process of electronic component testing including probe out-of-position sensing according to one implementation of the teachings herein.

FIG. 2 is a flowchart of a process 200 of electronic component testing including probe out-of-position sensing according to one implementation of the teachings herein. Process 200 is described with reference to system 100 for illustrative purposes, but process 200 can be implemented in a variety of test system configurations. Further, process 200 is depicted and described as a series of steps for simplicity of explanation. However, steps in accordance with this disclosure can occur in various orders and/or concurrently. Additionally, steps in accordance with this disclosure may occur with other steps not presented and described herein. Furthermore, not all illustrated steps may be required to implement a method in accordance with the disclosed subject matter At step 202, an electronic component 124 can be loaded into a component carrier 104, for example at load station 112. System 100 indexes component carrier 104 and thus component 124 to a test station (in this example test station 122), where probe 126 is moved by test station 122 in the direction of arrow 128 to contact component 124 at step 204. Probes 126 are generally mounted for a fixed displacement and have some resiliency so that each can form a tight contact with component 124 by deformation, for example. At step 206, tester 120 measures the force feedback from probe 126 as it is being moved up to contact component 124 and stores one or more measurements in memory 132 of controller 130 and/or in memory of tester 120. The time at which a measurement is made can also be recorded using a timer starting from, for example, when the movement of probe 126 begins.

Force feedback can be measured by any one of a variety of force measurement devices. For example, load cells or piezoelectric crystals can be used to measure force feedback of probe 126. A force measurement mechanism or device can be sampled periodically by controller 130 as probe 126 is being moved up to contact component 124 and the measurements stored in memory 132. At step 208, when movement of probe 126 is complete, controller 130 can compare the measurements stored in memory with nominal values of time and/or feedback force stored in memory 132 that were acquired by, for example, previous testing. If the stored measurements compare favorably with the nominal values, controller 130 can conclude that probe 126 has properly contacted component 124 in component carrier 104. For example, if probe 126 makes contact when in an amount of time is equal to a defined amount of time or makes contact with a feedback force equal to a defined peak feedback force when at a proper test height position, probe 126 has properly contacted component 124 in component carrier.

At step 210, if comparing the stored time and/or force feedback measurements to the nominal values indicates that a force feedback (e.g., a peak force feedback) has been reached too soon in either time or displacement of test probe 126, controller 130 can conclude that test probe 126 has missed its opening in component carrier 104 and has contacted component carrier 104 rather than component 124. At step 212, controller 130 issues an alert to, for example, an operator upon concluding that probe 126 has missed its opening. In this case, controller 130 can alert an operator of the test system to permit the operator to adjust test probe 126 or component carrier 104, for example. Alerting may include presenting messages to an operator, sounding an alarm, flashing lights or stopping system 100.

At step 214, controller 130 checks the measurements to insure that a peak force feedback measurement of sufficient magnitude has been recorded. If comparing the stored measurements to the predetermined nominal values indicates that a sufficiently large increase in force feedback does not occur while probe 126 is moved into the test position, controller 130 can conclude that no component is properly loaded in component carrier 104. This conclusion may occur when component 124 has been mis-loaded or when no component was initially loaded in carrier 104. At step 216, an alert issues in a similar manner as in step 212. In response, an operator may stop system 100 when, for example, component 124 is mis-loaded but ignore the warning when no component exists. It may also be desirable to store the cause of an alarm in a record form for troubleshooting and diagnostics of system 100. For example, a large number of alerts issuing in step 216 could indicate a problem at load station 112.

At step 218, controller 130 checks the measurements against the nominal values to determine if the timing and magnitude of the force feedback measurements are consistent with test probe 126 properly contacting an electronic component in the correct position. At step 218, if controller 130 determines that the measurements are not consistent with contacting component 124, controller 130 may signal an unknown error alert at step 220. At step 222, controller 130 has determined that the measurements are consistent with contacting component 124 in its proper position and system 100 continues testing without an alert.

Figure 3:
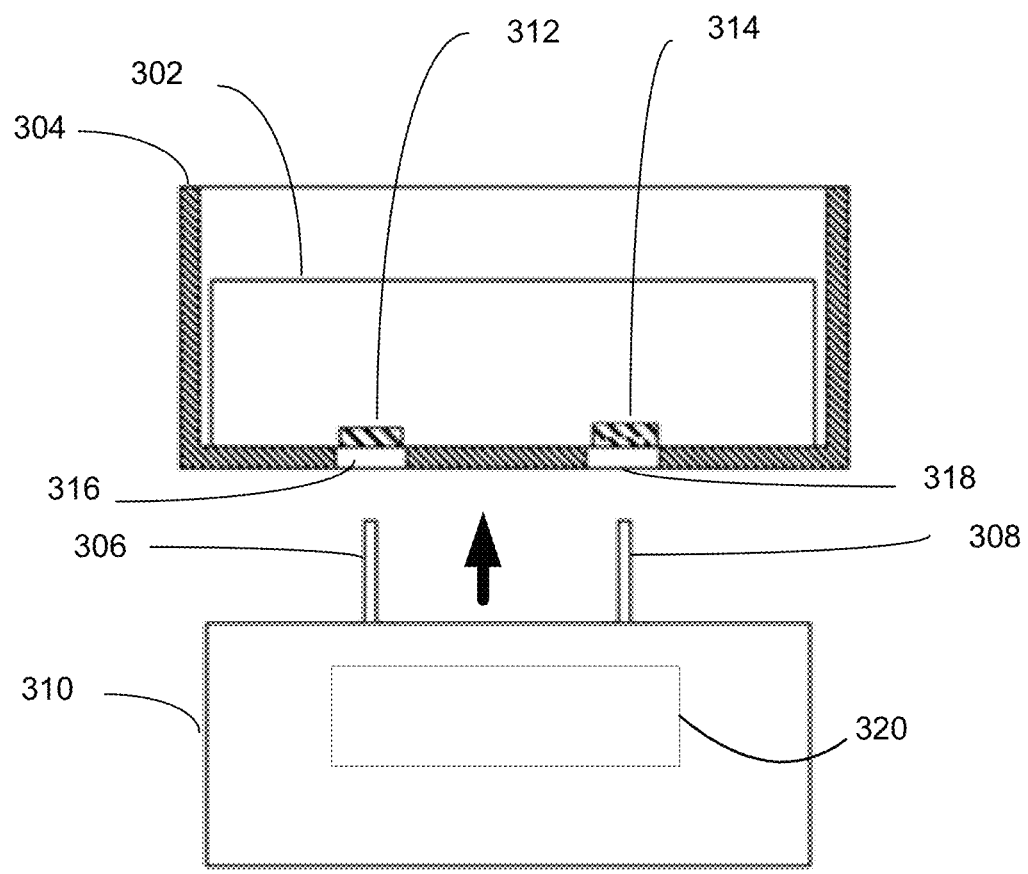
FIG. 3 is a diagram of an electronic component with test probes in an unengaged position.

FIG. 3 is a diagram of an electronic component 302 with probes 306, 308 in an unengaged position. Component 302 is supported in a component carrier 304 before being probed by test probes 306, 308. Test probes 306, 308 are included in a probe module 310 movable in the direction indicated by the arrow in order to contact pads 312, 314 of component 302 through holes 316, 318 provided in component carrier 304. Probe module 310 can be a component of test station 122, for example. The motion of probe module 310, and hence test probes 306, 308, can be accomplished mechanically, for example through mechanical linkages that detect component carrier 304 being indexed into position, or electrically, for example through solenoids or voice coils operating in response to detecting component carrier 304 being indexed into position, or a combination of both. Probe module 310 may also include or be in engaging contact with a force feedback mechanism 320 as discussed previously that measure the resistance to motion as the test probes are moved and communicates the measurements to controller 130. Force feedback mechanism 320 is shown as part of probe module 310. In practice, due to size and other constraints, a force feedback mechanism will be separate from probe module 310 and be in contact with probes 306, 308.

Figure 4:
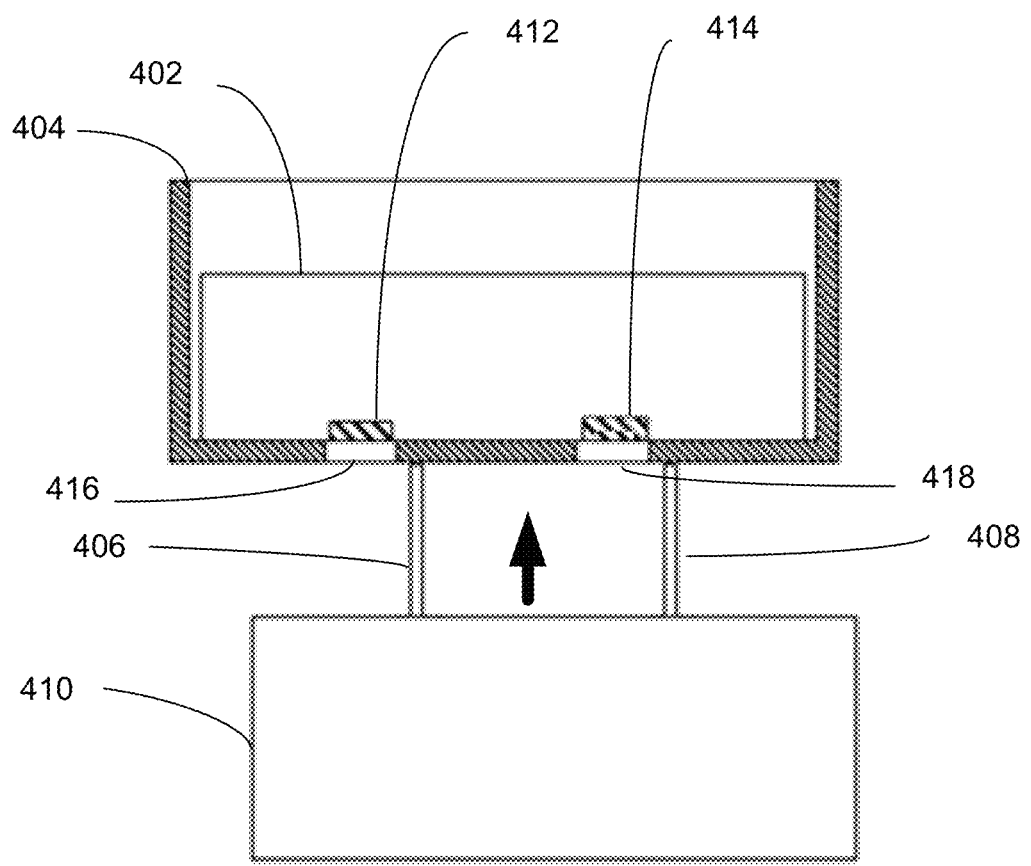
FIG. 4 is a diagram of an electronic component with test probes in an incorrect position.

FIG. 4 is a diagram of an electronic component 402 with test probes 406, 408 in an incorrect position. Component 402 is supported in a component carrier 404 and has pads 412 and 414. Test probes 406, 408 are supported by probe module 410. As shown, probe module 410 has moved probes 406, 408 up in the direction shown by the arrow. In this case, either probe module 410 (and hence probes 406, 408) or component carrier 404 is not aligned properly in the test system, such as system 100. This results in probes 406, 408 missing their respective holes 416, 418 in component carrier 404, thereby failing to make contact with pads 412, 414 of component 402. In this case, force feedback mechanisms in probe module 410 or in a tester in engagement with probes 406, 408 (such as tester 120) will send measurements to controller 130 that, based on a comparison with stored nominal values, cause controller 130 to conclude that probes 406, 408 are incorrectly positioned as described with respect to steps 210 and 212 of FIG. 2. This feedback may be, for example, an indication that a feedback force was received too early in the movement toward component 402 for probes 406, 408 to have reached pads 412, 414 of component 402. Accordingly, controller 130 may issue an alert as described above.

Figure 5:
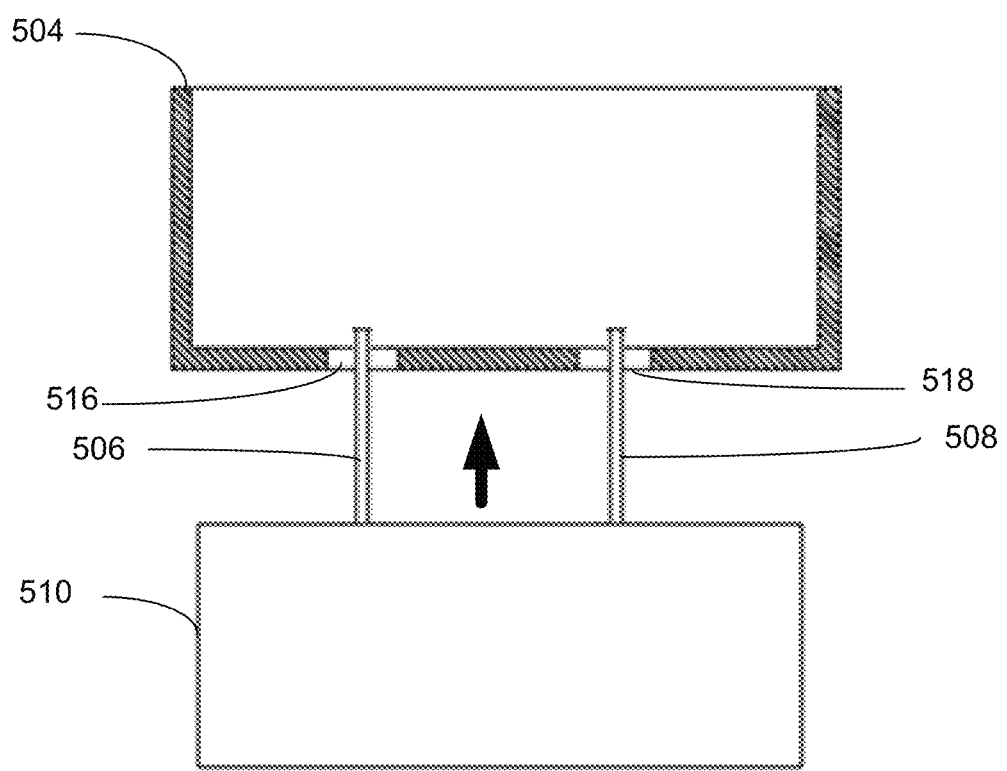
FIG. 5 is a diagram of test probes in an incorrect position due to a missing electronic component.

FIG. 5 is a diagram of test probes 506, 508 in an incorrect position due to a missing electronic component. In this case, component carrier 504 is without a loaded electronic component. Probe module 510 moves probes 506, 508 in the direction of the arrow up through openings 516, 518 in component carrier 504. Force feedback mechanism(s) can send measurements to controller 130 that indicate that resistance to motion by probes 506, 508 was not detected at the appropriate time or displacement and therefore can be indicative of a missing electronic component. Generally, when there is no component in carrier 504, but carrier 504 and probes 506, 508 are properly aligned, no feedback force will be measured. As discussed with respect to steps 214 and 216 of FIG. 2, an alert can issue for this situation.

Figure 6:
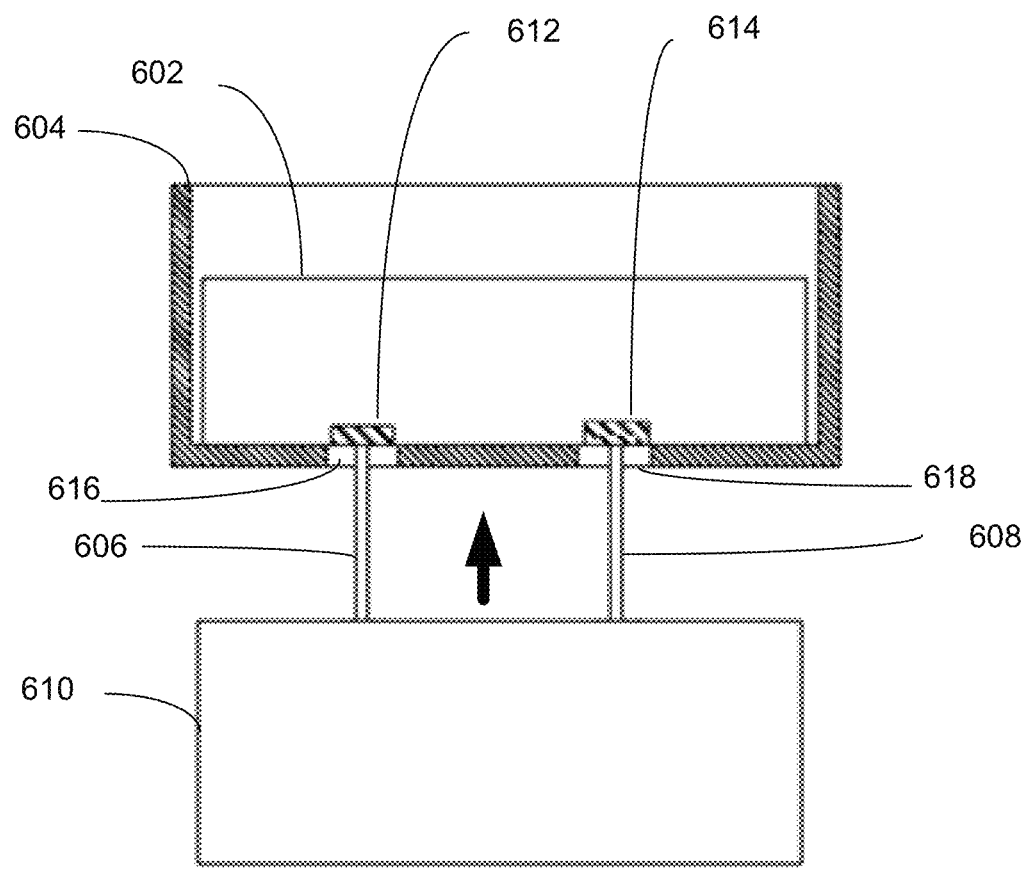
FIG. 6 is a diagram of an electronic component with test probes in a correct, aligned position.

FIG. 6 is a diagram of an electronic component 602 with test probes 606, 608 in a correct, aligned position. Component carrier 604 supports component 602, and probe module 610 supports probes 606, 608. In FIG. 6, probe module 610 has moved probes 606, 608 in the direction of the arrow to successfully contact pads 612, 614 of component 602 through holes 616, 618 of component carrier 604. Measurements taken by force feedback mechanism(s) and sent to controller 130 would be consistent with contacting pads 612, 614 with appropriate force at the appropriate time and/or displacement of test module 610 and test probes 606, 608 as described with respect to steps 218 and 222 of FIG. 2.

It is also envisioned that the measurements acquired by the force feedback mechanism(s) may not be consistent with any of the three cases presented above. In this case, controller 130 may signal an alert indicating an "unknown" to an operator as described with respect to steps 218 and 220 of FIG. 2. In certain embodiments, controller 130 may perform further analysis of the force feedback measurements and take actions to correct operation of the system without operator assistance. In such situations, the actions taken by the system to correct itself can be logged on controller 130 for review by an operator.

While this disclosure includes certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for testing electronic components in an electronic component test system, the method comprising:
   moving a component carrier into a test station of the test system;
   moving a test probe in a direction toward the component carrier while the component is in the test station, the component carrier having an opening for the test probe to pass through when the test probe is in a test position;
   measuring a feedback force of the test probe while moving the test probe in the direction toward the component carrier; and
   determining, using a controller, whether the test probe makes contact with the component carrier based on the feedback force.

2. The method of claim 1 wherein determining whether the test probe makes contact with the component carrier comprises determining that the test probe makes contact with a contact pad of an electronic component through the opening based on the feedback force, the electronic component supported by the component carrier, such that the test probe does not make contact with the component carrier.

3. The method of claim 2, further comprising:
   measuring a test parameter of the electronic component using the contact between the test probe and the contact pad.

4. The method of claim 2 wherein determining that the test probe makes contact with the contact pad of the electronic component comprises:
   comparing an amount of time for an occurrence of a positive value for the feedback force while moving the test probe in the direction toward the component carrier to a defined amount of time; and
   concluding that the test probe makes contact with the contact pad when the amount of time is equal to the defined amount of time.

5. The method of claim 1 wherein determining whether the test probe makes contact with the component carrier comprises:
   comparing an amount of time for an occurrence of a positive value of the feedback force while moving the test probe in the direction toward the component carrier to a defined amount of time; and
   concluding that the test probe makes contact with the component carrier when the amount of time is less than the defined amount of time.

6. The method of claim 1 wherein determining whether the test probe makes contact with the component carrier comprises:
   comparing the feedback force when the test probe reaches the test position with a defined feedback force; and
   concluding that the test probe makes contact with the component carrier if the feedback force is greater than the defined feedback force.

7. The method of claim 1 wherein determining whether the test probe makes contact with the component carrier comprises:
   comparing the feedback force when the test probe reaches the test position with a defined feedback force;
   concluding that the test probe makes contact with neither a contact pad of an electronic component through the opening nor the component carrier if the feedback force is less than the defined feedback force; and concluding that the test probe makes contact with a contact pad of an electronic component through the opening, such that the test probe does not make contact with the component carrier, if the feedback force is equal to the defined feedback force.

8. The method of claim 1, further comprising:
issuing an alert when the test probe makes contact with the component carrier.

9. The method of claim 1 wherein determining whether the test probe makes contact with the component carrier comprises determining that the test probe makes no contact over a range of travel from a starting position to the test position.

10. The method of claim 9 wherein determining that the test probe makes no contact over the range of travel comprises concluding that the feedback force has a constant value of zero over the range of travel.

11. The method of claim 9, further comprising:
issuing an alert when the test probe makes no contact over the range of travel.

12. The method of claim 1 wherein determining whether the test probe makes contact with the component carrier based on the feedback force comprises determining whether the test probe makes contact with the component carrier based on the feedback force and an amount of time to reach a defined feedback force.

13. An apparatus for testing electronic components in an electronic component test system, comprising:
a test station including a test probe configured to transmit a signal to an electronic component;
a component carrier configured to support the electronic component and having an opening for the test probe to pass through when the component carrier is in the test station and the test probe is in a test position;
a force measurement device configured to measure a feedback force of the test probe while moving the test probe in a direction toward the component carrier; and
a controller configured to determine whether the test probe makes contact with the component carrier based on the feedback force.

14. The apparatus of claim 13, further comprising:
a probe module supporting the test probe and controlled by the controller to move test probe over a range of travel from a starting position to the test position.

15. The apparatus of claim 14 wherein the controller is configured to determine that the test probe does not makes contact with the component carrier when no feedback force is measured over the range of travel.

16. The apparatus of claim 13 wherein the controller is configured to generate an alarm when the test probe makes contact with the component carrier.

17. The apparatus of claim 13 wherein the controller is configured to determine that the test probe makes contact with the component carrier when an amount of time for an occurrence of a positive value of the feedback force while moving the test probe in the direction toward the component carrier is less than a defined amount of time.

18. The apparatus of claim 13 wherein the controller is configured to determine that the test probe makes contact with the component carrier when the feedback force when the test probe reaches the test position is greater than a defined feedback force.

19. The apparatus of claim 13 wherein the controller is configured to determine that the test probe makes contact with a contact pad of an electronic component through the opening based on the feedback force, the electronic component supported by the component carrier; and wherein the controller is configured to determine that the test probe does not make contact with the component carrier when the test probe makes contact with the contact pad.

20. The apparatus of claim 19 wherein the controller is configured to obtain a measurement of a test parameter of the electronic component using the contact between the test probe and the contact pad.

* * * * *